United States Patent [19]

Denda

[11] Patent Number: 4,924,297

[45] Date of Patent: May 8, 1990

[54] SEMICONDUCTOR DEVICE PACKAGE STRUCTURE

[75] Inventor: Masahiko Denda, Itami, Japan

[73] Assignee: Director General, Agency of Industrial Science and Technology, Japan

[21] Appl. No.: 175,276

[22] Filed: Mar. 30, 1988

[30] Foreign Application Priority Data

Jul. 22, 1987 [JP] Japan .................................. 62-181157

[51] Int. Cl.[5] ...................... H01L 23/04; H01L 23/12
[52] U.S. Cl. ......................................... 357/74; 357/68; 357/80
[58] Field of Search ............................. 357/74, 80, 68; 174/52 FP

[56] References Cited

FOREIGN PATENT DOCUMENTS

| 0157048 | 12/1981 | Japan | 357/74 |
| 0079725 | 5/1983 | Japan | 357/70 |
| 0043154 | 2/1987 | Japan | 357/74 |

OTHER PUBLICATIONS

Kohn, "A Charge-Coupled Infrared Imaging Array with Schottky-Barrier Detectors", Journal of Solid State Circuits, vol. SC-11, No. 1, Feb. 1976.
Kozonocky et al, "High-Performance Schottky-Barrier IR-CCD Image Sensors", Proceedings of the 14th Conference (1982 International) on Solid State Devices, Tokyom 1982.
Elabd et al, "High Density Schottky Barrier . . . at Intermediate Temperature", SPIE, vol. 35 . . . (1982).

*Primary Examiner*—Rolf Hille
*Assistant Examiner*—S. V. Clark
*Attorney, Agent, or Firm*—Leydig, Voit & Mayer

[57] ABSTRACT

A semiconductor device package comprising a package wall through which the position of the semiconductor device is to be determined. The package wall has apertures for exposing edges of the semiconductor device, thereby allowing the position of the semiconductor device to be determined accurately.

4 Claims, 2 Drawing Sheets

SEMICONDUCTOR DEVICE PACKAGE STRUCTURE

BACKGROUND OF THE INVENTION

This invention relates to a package structure for supporting a semiconductor device and, more particularly, to a package for supporting a semiconductor device comprising a package wall through which an accurate position of the semiconductor device is to be determined.

Recent progress in the field of semiconductor devices for infrared detectors has been significant. Particularly, detectors using a silicon Schottky barrier type semiconductor device for monitoring the wavelength range of from 3 to 5 μm can be realized with a monolithic two dimensional detector having 512×512 image pixels providing a superior image.

Most silicon Schottky barrier type infrared detectors are designed to receive incoming infrared rays at a silicon substrate surface which is the bottom or back of the semiconductor device, on the opposite side of the substrate from the surface on which the semiconductor element is formed. The infrared rays are photoelectrically converted into an electric current at the Schottky barrier in the semiconductor element on the face side of the semiconductor device.

FIG. 1 illustrates in cross section one example of a known semiconductor device 1 which can be contained within a package for use as a semiconductor infrared ray detector. It is seen that the semiconductor device 1 comprises a silicon substrate 2 and a semiconductor element 3, including inter alia a Schottky barrier 4, formed on the silicon substrate 2. Thus, the semiconductor device 1 has a first major surface 5 which is defined by the upper surface of the semiconductor element 3 and a second major surface 6 which is defined by the bottom surface of the silicon substrate 2. While not seen from FIG. 1, the semiconductor device 1 is substantially rectangular in plan and has four corners as seen in FIG. 2 which will be described later. The semiconductor device 1 receives incident infrared rays from the second major surface 6 as shown by an arrow 7.

In FIGS. 2 and 3, it is seen that the semiconductor device 1 shown in FIG. 1 is mounted within a package 8 for an infrared ray detector. The package 8 is a substantially box-shaped container having a main body 9 with a rectangular top wall 10, four side walls 11 and a cover plate 12. The top wall 10 is provided with a rectangular exposure window 13 which has length and width dimensions smaller than those of the rectangular semiconductor device 1. The semiconductor device 1 is attached at the periphery of its back face or the second major surface 6 to the inner surface of the package top wall 10. Accordingly, a substantial portion of the central area of the second major surface 6 of the semiconductor device 1 is exposed through the exposure window 13, so that the second major surface 6 which is the surface of the semiconductor device 1 for receiving infrared rays, can be irradiated by the infrared rays to be monitored.

With the above described conventional package structure for a semiconductor device, the semiconductor device 1 is mounted within the package 8 so that the second major surface 6, which is the back face of the semiconductor device 1, is exposed through the exposure window 13 formed in the package 8. However, semiconductor element 3 on the face side of the device 1 cannot be detected through the exposure window 13. Therefore, the exact position of the semiconductor device 1 cannot be determined from the infrared ray receiving side of the package 8, making it very difficult to precisely position a spectral filter or a cooler on the infrared ray receiving side of the package 8 with respect to the detector element such as the Schottky barrier 4 of the semiconductor device 1.

Thus, with the package structure of the conventional design, when it is necessary to position a cooler on the back side or the second major surface 6 of the semiconductor device 1 with respect to the infrared ray detecting element 4 on the first major surface 5 of the semiconductor device 1, a position indicating mark must be provided on the back side or the second major surface 6 of the semiconductor device 1 in relation to the infrared ray detecting element 4 on the first major surface 5. This complicates the manufacture of the semiconductor infrared detector. Further, in the infrared ray detector such as the two-dimensional detector in which the area of the infrared ray detecting element 4 is large and extends over substantially the entirety of the semiconductor element 3, it has been necessary to arrange the above-mentioned position indicating mark so as to have no optical influence on the detection of infrared rays.

SUMMARY OF THE INVENTION

Accordingly, an object of the present invention is to provide a semiconductor device package structure in which the precise position of the semiconductor device can be determined through a support member for the semiconductor device.

Another object of the present invention is to provide a semiconductor device package in which the precise position of the semiconductor device can be determined through a support member.

A further object of the present invention is to provide a semiconductor device package which provides a means for indicating the precise position of the semiconductor device through a support member.

Another object of the present invention is to provide a semiconductor device package in which a means for indicating the precise position of the semiconductor device through a support member has no undesirable influence on the detecting function of the semiconductor device.

With the above objects in view, the semiconductor device package of the present invention comprises a package wall through which the accurate position of the semiconductor device having a semiconductor element on one of its major surfaces can be determined. The package wall has apertures for exposing the corners of the semiconductor device thereby allowing the accurately position of the semiconductor device to be determined through the package wall. The package wall has an exposure window through which a substantial central portion of the other of its major surfaces is exposed, and the semiconductor device is attached at the periphery of the other of its major surfaces to an edge of the exposure window.

DESCRIPTION OF THE PREFERRED EMBODIMENTS

Figure 1:
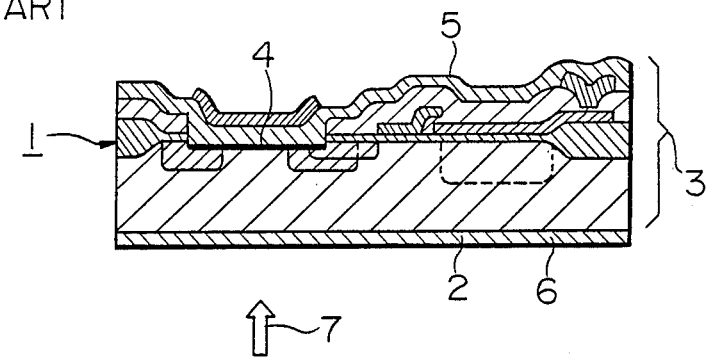
FIG. 1 is a cross-sectional view of an infrared ray detecting semiconductor device which can be used in the package of the present invention.
Figure 2:
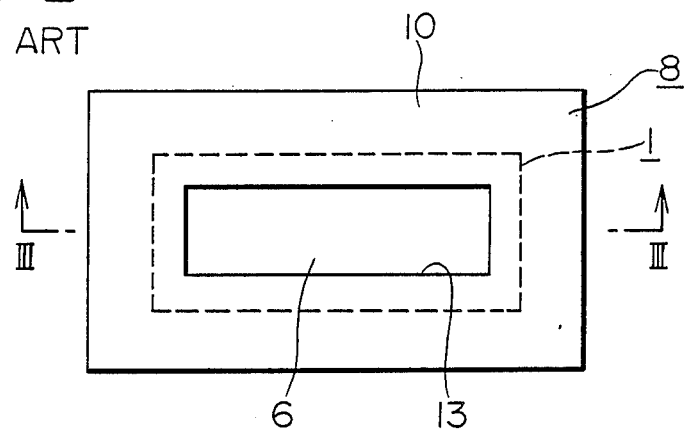
FIG. 2 is a plan view of an infrared ray detector with the package structure of conventional design.
Figure 3:
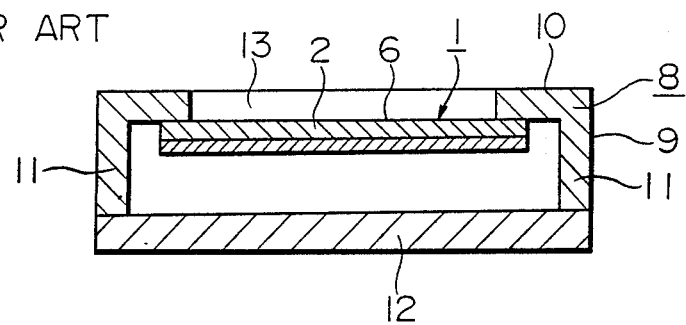
FIG. 3 is a sectional side view taken along line III—III of FIG. 2.
Figure 4:
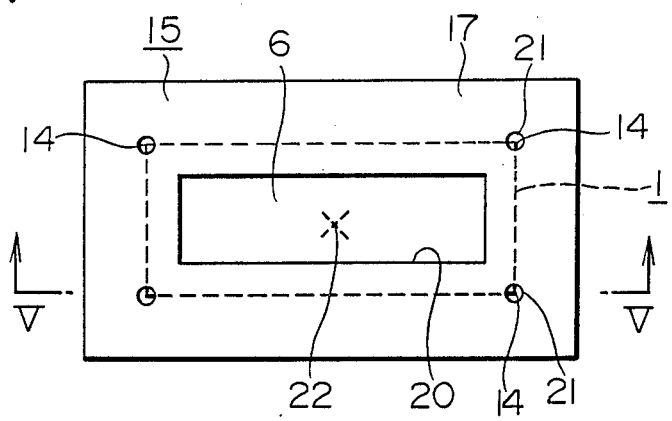
FIG. 4 is a plan view of an infrared ray detector with the package structure of the present invention.
Figure 5:
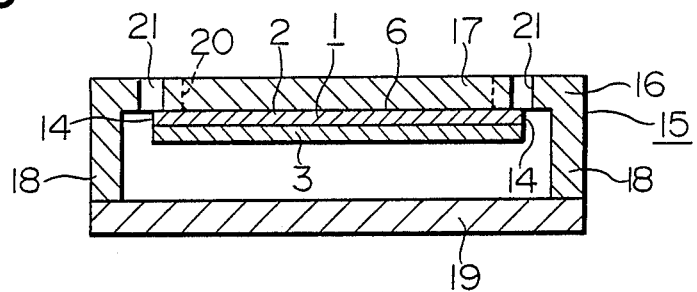
FIG. 5 is a sectional side view taken along line V—V of FIG. 4.

In FIGS. 4 and 5 which illustrate a package 15 for a semiconductor device of the present invention, it is seen that a semiconductor device 1, which is the same as that shown in FIG. 1, is mounted within the package 15 for an infrared ray detector. The package 15 is a substantially box-shaped container having a main body 16 with a rectangular top wall 17, four side walls 18 and a cover plate 19. The top wall 17 is provided with a rectangular exposure window 20 which has length and width dimensions smaller than those of the rectangular semiconductor device 1. The semiconductor device 1 is attached at the periphery of its back face or the second major surface 6 to the inner surface of the package top wall 17. Accordingly, a substantial portion of the central area of the second major surface 6 of the semiconductor device 1 is exposed through the exposure window 20, so that the second major surface 6 which is the surface of the semiconductor device 1 for receiving infrared rays, can be irradiated by the infrared rays to be monitored.

According to the present invention, the top wall 17 of the semiconductor device package 15 has four apertures 21 formed in the top wall 17 for allowing the detection of the corners 14 of the semiconductor device 1 attached to the package 15. The apertures 21 are circular, and the diameter of the apertures 21 may be from 1 mm to 2 mm. The apertures 21 are located at the positions on the top wall 17 corresponding to four corners 14 of the semiconductor device 1 so that the corners 14 are exposed and can be detected through the apertures 21. Therefore, the precise position of the semiconductor device 1 can be determined by detecting the corners 14 of the semiconductor device.

When any suitable reference point 22 on the pattern on the first major surface 5 of the semiconductor device 1 is selected, the distances between the reference point 22 and each corner 14 can be easily measured after the individual semiconductor device is scribed from semiconductor wafer and before the semiconductor device 1 is attached to the package 15. Once the above distances are known, the precise position of the reference point 22 which is on the first major surface 5 of the semiconductor device 1 can be easily determined from the second major surface 6 by simply plotting a point at the same distances from each of the corners 14 of the semiconductor device 1. Although this determination of the position of the reference point on the semiconductor device 1 is indirectly achieved through the positions of the corners 14 of the semiconductor device 1, since non-contact type measuring devices easily provide an accuracy of $\pm 1$ $\mu$m, the dimensional error between the reference point 22 on the semiconductor device 1 and a point on the package 15 or another component associated with the package 15 can be maintained at levels not exceeding $\pm 2$ $\mu$m.

Since the dimensional error during scribing does not exceed 50 $\mu$m, and the side faces of the semiconductor device 1 are substantially perpendicular to the wafer surface, the positioning of the semiconductor device 1 relative to the package 15 so that the corners 14 of the semiconductor device 1 are exposed through the apertures 21 can be easily achieved when the apertures 21 located at the predetermined positions have a diameter of from about 1 mm to 2 mm.

Once the precise position of the semiconductor device 1 or the reference point 22 has been determined, it is possible to mount a spectrometer precisely with respect to the detecting element of the semiconductor device 1, or it is possible to precisely adjust the position of a cooler relative to the detecting element.

Figure 6:
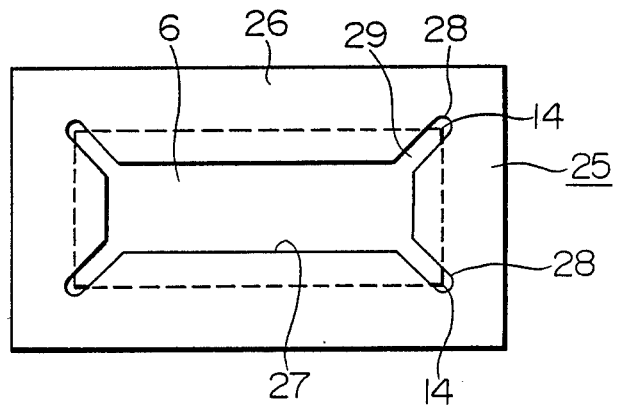
FIG. 6 is a plan view of a modified detector package structure of the present invention.

FIG. 6 illustrates another embodiment of the semiconductor device package 25. The package 25 comprises a top wall 26 having a window 27 through which the back face or the second major surface 6 of the semiconductor device 1 is exposed and as well as apertures 28. The apertures 28 may be the same as the apertures 21 of the embodiment shown in FIGS. 4 and 5 except that they are connected to the window 27 by slits 29 so that the apertures 28 are continuous extensions of the window 27.

While four apertures 21 or 28 are provided in the embodiments described in conjunction with FIGS. 4 to 6, at least two apertures 21 or 28 may be sufficient to obtain desired results.

As has been described, according to the present invention, the precise position of the semiconductor device can be determined through the support member for the semiconductor device without the need for providing a position indicating mark on the back face of the semiconductor device 1, which may undesirably influence the detection of infrared rays. Also, the package structure of the present invention is simple.

What is claimed is:

1. A semiconductor device package for containing a semiconductor device, said package including an outside package wall on which a semiconductor device having edges may be mounted, said package wall having at least two apertures therein for exposing edges of the semiconductor device for accurately determining the position of the semiconductor device within the package.

2. The semiconductor device package as claimed in claim 1 wherein said package wall includes a window therethrough intermediate said apertures through which a portion of the semiconductor device is exposed.

3. The semiconductor device package as claimed in claim 1 including four apertures therein for exposing edges of said semiconductor device.

4. The semiconductor device package as claimed in claim 2 wherein said apertures are continuous with said window.

* * * * *